United States Patent
Maheshwari et al.

(10) Patent No.: US 7,346,823 B1
(45) Date of Patent: Mar. 18, 2008

(54) AUTOMATIC BUILT-IN SELF-TEST OF LOGIC WITH SEEDING FROM ON-CHIP MEMORY

(75) Inventors: Dinesh Maheshwari, Fremont, CA (US); Andrew Wright, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 74 days.

(21) Appl. No.: 10/876,864

(22) Filed: Jun. 24, 2004

(51) Int. Cl.
*G01R 31/28* (2006.01)
(52) U.S. Cl. ...................... 714/733; 714/738
(58) Field of Classification Search ............ 708/200; 365/230.03; 714/736, 739, 738, 733, 729
See application file for complete search history.

(56) References Cited

U.S. PATENT DOCUMENTS

| | | | |
|---|---|---|---|
| 5,539,682 A * | 7/1996 | Jain et al. ............ | 708/200 |
| 5,574,733 A | 11/1996 | Kim | |
| 5,598,373 A * | 1/1997 | Wada et al. ......... | 365/230.03 |
| 5,991,909 A * | 11/1999 | Rajski et al. ........ | 714/729 |
| 6,327,685 B1 | 12/2001 | Koprowski et al. | |
| 6,550,034 B1 | 4/2003 | Riedlinger et al. | |
| 6,584,592 B2 | 6/2003 | Omura et al. | |
| 6,671,843 B1 | 12/2003 | Kebichi et al. | |
| 6,684,358 B1 * | 1/2004 | Rajski et al. ......... | 714/739 |
| 6,807,646 B1 * | 10/2004 | Williams et al. ...... | 714/736 |
| 6,922,803 B2 * | 7/2005 | Nakao et al. ......... | 714/738 |
| 6,961,886 B2 | 11/2005 | Motika et al. | |
| 2001/0021988 A1 | 9/2001 | Omura et al. | |

OTHER PUBLICATIONS

"On Calculating Efficient LFSR Seeds for Built-In Self Test" *1999 IEEE European Test Workshop*, Sep. 24-27, 1999.
"Efficient Compression and Application of Deterministic Patterns in a Logic BIST Architecture" *DAC 2003*, Jun. 2-6, 2003.

* cited by examiner

*Primary Examiner*—David Ton
(74) *Attorney, Agent, or Firm*—Haverstock & Owens, LLP

(57) ABSTRACT

Built-in self-test (BIST) devices and methods are disclosed. A BIST section (100) according to one embodiment can include a built-in seed value memory (150) that stores multiple seed values. In a BIST operation, a seed value can be transferred from a built-in seed memory (150) to a test pattern generator (106) to generate multiple test patterns for scan chains (104-0 to 104-*n*). Successive seed values can be transferred to generate multiple test patterns sets at a clock speed and/or to achieve a desired test coverage.

18 Claims, 6 Drawing Sheets

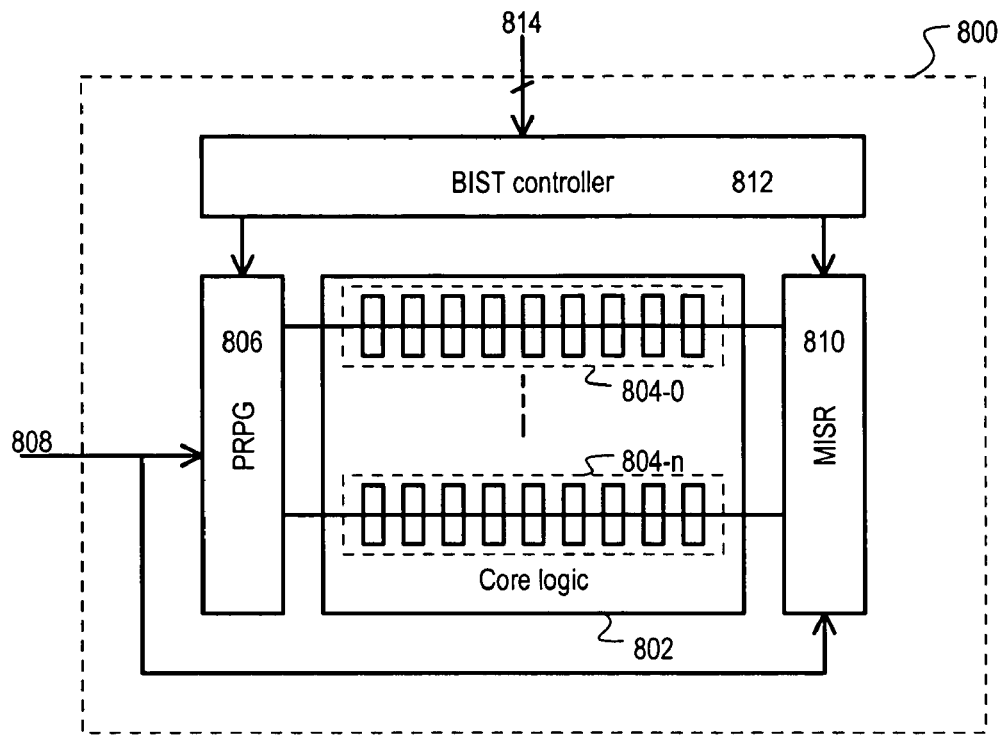
FIG. 8 (BACKGROUND ART)
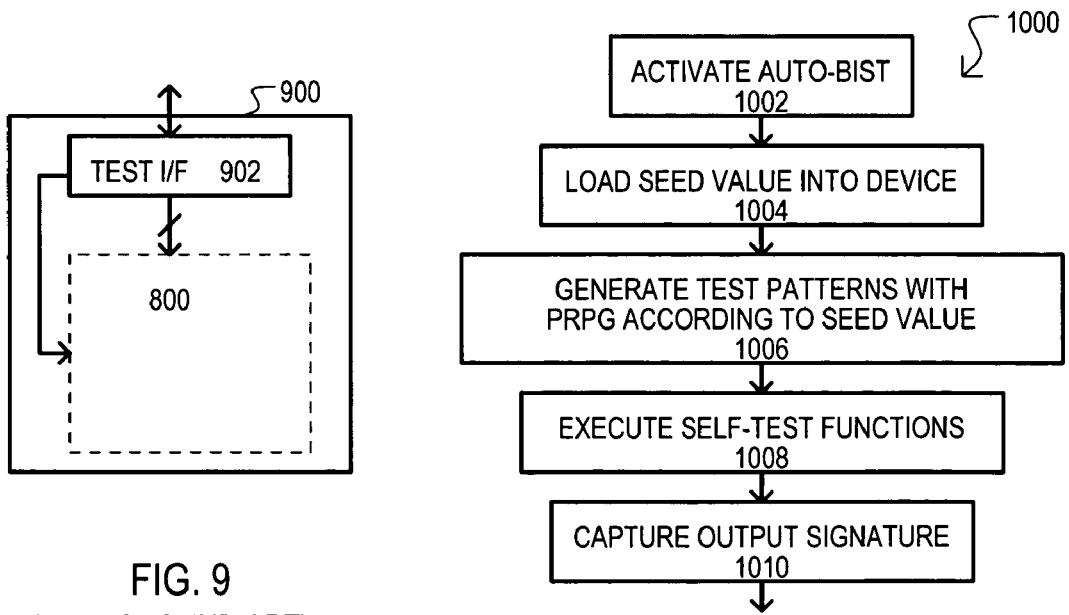
FIG. 9
(BACKGROUND ART)
FIG. 10
(BACKGROUND ART)

AUTOMATIC BUILT-IN SELF-TEST OF LOGIC WITH SEEDING FROM ON-CHIP MEMORY

TECHNICAL FIELD

The present invention relates generally to the self-testing of integrated circuits, and more particularly to integrated circuits having a built-in self-test (BIST) capability.

BACKGROUND OF THE INVENTION

The testing of integrated circuits can occur throughout the life of a device. An integrated circuit may be tested in die form, while still part of a wafer, in packaged form at the "back" end of a manufacturing process, and/or after the device has been incorporated into a system ("in system" testing).

Self-test can increase the speed at which a device is tested, as an integrated circuit can typically operate at a faster speed than a tester. Moreover, built-in self-test (BIST) circuits can incorporate more complex test functions on the device itself, which can reduce or eliminate the need for expensive complex tester equipment.

While self-test can perform an important function in screening new devices, self-test can also perform an important function once a device is in system. If a defective device is properly diagnosed by a self-test, the device can include built-in self-repair (BISR) circuits for repairing the device. Unfortunately, such an approach is typically only possible for relatively simple devices, as conventional BIST circuits for more complex device do not provide sufficient test "coverage". That is, a self-test may not be thorough enough, or test enough features/combinations of a device to adequately determine the location and/or type of defect.

Due to the complexity of many integrated circuits, it may be desirable to apply a number of test patterns (e.g., vectors) to self-test circuits, such as scan chains. Multiple test patterns can be generated by a tester and applied to a device. However, even with very expensive high speed testers, such an approach may take considerable time and/or not apply such values at the clock speed (e.g., normal operating speed) of the integrated circuit.

One conventional approach to generating test patterns at clock speed is to include a "built-in" test pattern generator on a device. That is, a test pattern generator can be included in the integrated circuit substrate and/or the package of the integrated circuit. In order to apply a wide variety of test pattern at a rapid speed, such a built-in test pattern generator can be a pseudo-random pattern generator (PRPG). Conventional PRPGs typically utilize a linear feedback shift register (LFSR).

A conventional PRPG can operate according to seed values (or "seeds"). Seed values can be initial patterns from which a series of subsequent test patterns can be generated. A test coverage can thus depend upon the number of seed values that are applied to a PRPG.

At the same time is it desirable to generate test patterns in a rapid fashion, it is also desirable to capture self-test results in a rapid pattern. One conventional approach for capturing test results at clock speed is to include a "built-in" output register. In order to capture output data in a rapid fashion, conventional BIST circuits can employ a multiple-input signature register (MISR). An MISR can compress multiple output pattern results in to a "signature" for subsequent readout/comparison with an expected "good" signature (a signature corresponding to properly functioning device).

To better understand the various features of the embodiments of the present invention, conventional BIST approaches will now be described in more detail.

Referring now to FIG. 8, a conventional BIST section of an integrated circuit is set forth in block diagram and designated by the general reference character 800. A BIST section 800 can include a "core" logic portion 802 that can be self-tested. One or more scan chains (804-0 to 804-n) and be included in, or associated with, a core logic portion 802. As is well understood, scan chains (804-0 to 804-n) can deliver test patterns to, and output test data from, a logic portion 802 to thereby test the operation of the logic portion 802.

The BIST section 800 of FIG. 8 includes a PRPG 806 that can receive test seed values from a test input 808, and generate test patterns for propagation down scan chains (804-0 to 804-n). An MISR 810 can receive values from scan chains (804-0 to 804-n) and from test input 808 and determine whether a logic portion 802 passes a particular self-test.

As shown in FIG. 8, both a PRPG 806 and MISR 810 can be controlled by a BIST controller 812. A BIST controller 812 can be operated according to control data received at a BIST control input 814.

Referring to now to FIG. 9, an integrated circuit that incorporates a BIST section 800 is shown in a block schematic diagram. An integrated circuit 900 can include at test interface 902 that controls the application of data to a BIST section 800. As but one example, many test interfaces 902 can be serial interfaces to thereby reduce the pin count required for a self-test.

FIG. 10 shows one example of a conventional auto-BIST operation. The method is designated by the reference character 1000 and includes activating an auto-BIST function (1002). Such a step can activate BIST circuits within a device (e.g., PRPG, BIST controller, MISR). A seed value device may then be loaded into the device (1004). Such a step may include loading an inherent seed value by start-up state of a PRPG and/or inputting a seed value from outside the device (e.g., serial shifting in a seed value).

A method 1000 may continue by generating test patterns with the PRPG according to the seed value (1006). According to such test values, a portion of the device (e.g., core logic portion) can be self-tested (1008). An output signature resulting from such a self-test can be captured, for example, by operation of an MISR.

While a conventional auto-BIST approach like that of FIG. 10 may be sufficient for simple devices, such an approach may not be adequate or fast enough for more complex devices. In particular, self-testing from a single seed value may not provide adequate coverage of device functions to properly diagnose/determine fault. However, while it may be possible to input more seed values, this can be very time consuming. Further, such an approach may not permit clock speed testing based on multiple seed values, as the device operation would have to stop between the loading of each seed value.

A second conventional test approach is shown in FIG. 11, and designated by the general reference character 1100. FIG. 11 shows the use of automatic test equipment ATE to provide a high coverage and relatively high speed test for a device like that shown in FIG. 8.

In FIG. 11, ATE 1102 can generate test control values and test data for a BIST section 800 of an integrated circuit. Further, ATE 1102 can include a memory 1104 in which to store multiple seed values. Thus, as a PRPG completes the generation of test patterns based on one seed value, an ATE 1102 can load a next seed value.

A conventional approach like that shown in FIG. 11 can provide wide test coverage by loading multiple seed values. However, such an approach may still not be capable of providing at clock speed testing, as the loading of seed values may still require some time. In addition, such an approach can be costly as ATE equipment and ATE test times can be expensive. Still further, the approach like that shown in FIG. 11, testing by ATE is typically not possible once a device is "in system".

In light of the above, it would be desirable to arrive at some way of executing a BIST operation in a device that provides wide test coverage at high speeds, but is not as costly as conventional ATE arrangements.

In addition, it would also be desirable to arrive at a BIST approach that is compatible with built-in self-repair for complex integrated circuits.

SUMMARY OF THE INVENTION

The present invention can include an integrated circuit device having a self-test capability. The device can include a test pattern generator that can generate a plurality of test pattern values for built-in self-test (BIST) registers in response to a single seed value. The device can also include a seed value store coupled to the test pattern generator that stores a plurality seed values. A seed selector circuit coupled to the seed value store can select a seed value for input to the test pattern generator.

Such an arrangement can allow for an integrated circuit device to include multiple seed values that are rapidly available for BIST operations. In this way, a device may include a self-contained set of seed values for a high degree of test coverage. This can dispense with the need for expensive automatic test equipment (ATE) that sequentially loads seed values into a device.

According to one aspect of the embodiments, a test pattern generator can include a linear feedback shift register. Such an arrangement can allow for rapid generation of test patterns from seed values provided by a seed value memory.

According to another aspect of the embodiments, a seed value store comprises a random access memory (RAM). Such an arrangement can allow for seed values to be written into a seed value memory from an external source. This allows more flexibility in the selection of seed values.

According to another aspect of the embodiments, a seed value memory can include a RAM with volatile storage circuits. In addition, an integrated circuit can include a data input for writing seed values to the RAM from outside the integrated circuit. Such an arrangement can allow for rapid input of seed values into a seed value memory from an external source.

In various particular arrangements, the volatile storage circuits of a seed value memory can include dynamic RAM cells, static RAM cells, content addressable memory (CAM) cells, pseudo static RAM cells, as but a few examples.

According to another aspect of the embodiments, a seed value memory can include a RAM having nonvolatile storage circuits. Such an arrangement can allow an integrated circuit device to store seed values in the absence of power.

In various particular arrangements, nonvolatile storage circuits can include mask read only memory (ROM) cells, electrically programmable ROM cells, electrically erasable and programmable ROM cells, magnetic RAM cells, and ferroelectric RAM cells, to name but a few examples.

According to another aspect of the embodiments, an integrated circuit may also include a seed value multiplexer having a first input coupled to the seed value store, a second input coupled to an external seed input, and an output coupled to the test pattern generator. In such an arrangement, seed values may be selected from a seed value memory of the integrated circuit, or from an external source.

According to another aspect of the embodiments, an integrated circuit may also include a BIST controller that controls the input of test pattern values from the test pattern generator to BIST latches corresponding to logic circuits of the integrated circuit. In this way, test patterns generated from seed values may be applied according to a BIST controller.

According to another aspect of the embodiments, an integrated circuit may also include a multiple input signature register that compresses multiple output values from BIST latches to generate output signatures. Such an arrangement can allow for BIST results to be compressed for more rapid and/or compact evaluation of test results.

According to another aspect of the embodiments, an integrated circuit may also include a BIST control multiplexer having a first input coupled to a test mode controller, a second input coupled to an external control input, and an output coupled to BIST controller. In this way, BIST operations may be controlled according to a test mode controller of the integrated circuit device, or according to an external source.

The present invention also includes a method for self-testing an integrated circuit device. The method includes loading a first seed value of a plurality of seed values stored by the integrated circuit device into a test pattern generator, generating a plurality of test patterns from the loaded seed value, and self-testing a portion of the integrated circuit according to the patterns. In this way, multiple seed values can be available for rapid application in BIST operations.

According to another aspect of the embodiments, a step of loading a first seed value can include applying an address value to random access type memory that stores the seed values.

According to another aspect of the embodiments, a step of loading a first seed value can include enabling a multiplexer path between a memory that stores the seed values and a pattern generating circuit.

According to another aspect of the embodiments, a method may also include establishing a plurality of seed values within a seed value memory formed in the integrated circuit. As but a few example, such a step can include programming a nonvolatile seed value memory circuit and/or writing values to a volatile seed value memory circuit.

According to another aspect of the embodiments, a method may also include determining if the step of self-testing the integrated circuit provides a predetermined level of coverage with respect to integrated circuit functions. If coverage does not meet the predetermined level, the method can repeat test operations with another seed value loaded from a seed value memory.

The present invention may also include an integrated circuit with a seed value memory formed in a substrate that stores a plurality of seed values. A test pattern generator formed in the substrate can have an input coupled to the seed value memory, and can generate a plurality test input values for BIST scan chains in response to a single seed value. An output register formed in the substrate can capture output values of the BIST scan chains.

According to one aspect of the embodiments, a seed value memory can include a random access memory, a test pattern generator can comprise a linear feedback shift register having a test pattern bit register corresponding to each scan chain, and an output register can comprises a multiple input signature registers having a test result bit register coupled to each scan chain.

BRIEF DESCRIPTION OF THE DRAWINGS

FIG. 8 is a block schematic diagram of a conventional BIST section.

FIG. 9 is a block diagram of a conventional integrated circuit having an auto-BIST capability.

FIG. 10 is a flow diagram of a conventional auto-BIST test method.

DETAILED DESCRIPTION

Various embodiments of the present invention will now be described in detail with reference to a number of drawings. The embodiments include a built-in self-test (BIST) section having a built-in seed value memory that can provide multiple seed values to a pattern generator. Such an arrangement can allow for higher speed and/or higher coverage BIST capabilities than conventional approaches.

Figure 1:
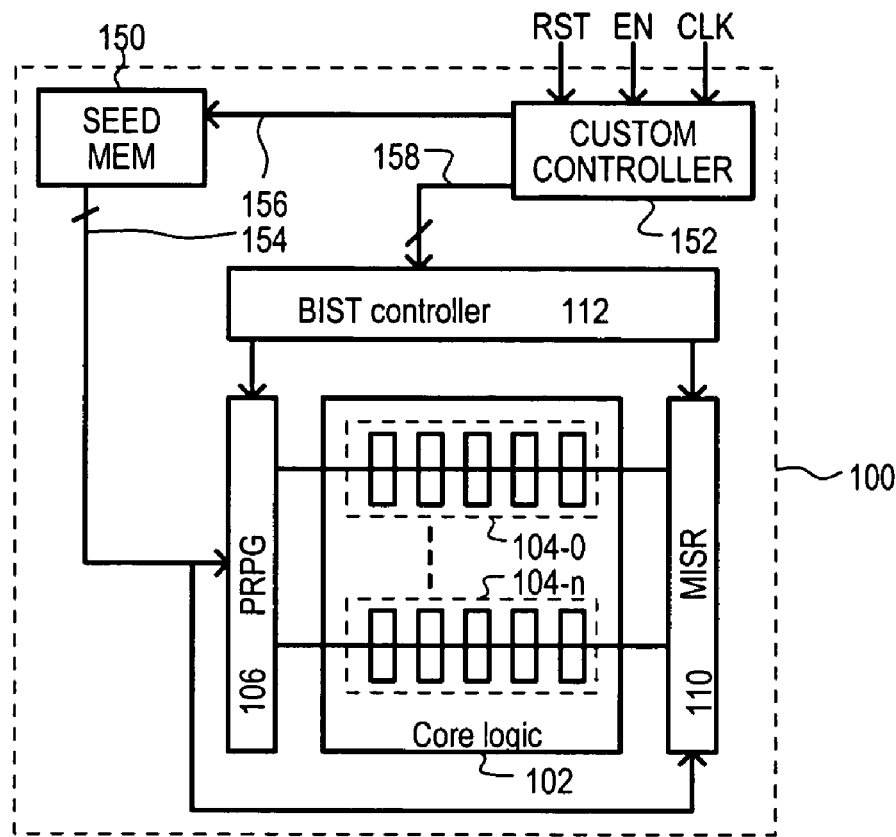
FIG. 1 is a block schematic diagram of a first embodiment of the present invention.

Referring now to FIG. 1, a BIST section according to a first embodiment is set forth in a block schematic diagram and designated by the general reference character 100. A BIST section 100 can include a tested section 102, a test pattern generator 106, a result output circuit 110, and a test controller 112. In addition, and unlike conventional BIST arrangements, a BIST section 100 can also include a seed value memory 150 and seed selector circuit 152.

In one very particular arrangement, a tested section 102 can include a core logic portion. A tested section 102 can be self-tested by way of one or more scan chains (104-0 to 104-n) coupled to and/or incorporated into tested section 102.

A test pattern generator 106 can generate multiple test patterns in response to a single seed value. A test pattern generator 106 can preferably include a pseudo-random pattern generator (PRPG), more preferably a PRPG that includes a linear feedback shift register (LFSR).

A result output circuit 110 can preferably include multiple registers for receiving values from each of a number of scan chains (104-0 to 104-n). Preferably, a result output circuit 110 can include a multiple input signature register (MISR).

A test controller 112 can control a test pattern generator 106 and/or result output circuit 110. Such a test controller 112 preferably operates at a clock speed of a tested section 102 enabling test patterns to be applied to scan chains and/or results read from scan chains at such a clock speed.

A seed value memory 150 can store multiple seed values. Any of the seed values can be provided to test pattern generator 106 by way of seed path 154. A seed value memory 150 can be "built-in" to device containing BIST section 100. Preferably, a seed value memory 150 can be formed in the same integrated circuit substrate as the other components of the BIST section 100. Still further, a seed value memory 150 can output seed values at a device clock speed.

A value seed memory 150 may take a variety of forms. A seed value memory 150 may be formed all or in part from non-volatile circuit elements, including but not limited to a mask programmable read-only-memory (ROM), an electrically programmable ROM (EPROM), electrically erasable programmable ROM (EEPROM), a magnetic random access memory (MRAM), and ferroelectric RAM (FRAM), fusible links, or anti-fuse type links, to name but a few.

In addition, or alternatively, a seed value memory 150 may be formed all or in part from volatile circuit elements, including but not limited to a dynamic RAM (DRAM), static RAM (SRAM), or other specialized memory device, such as a content addressable memory (CAM), as but a few examples.

As will be noted in other examples below, selection of particular memory types can have certain advantages.

A seed selector circuit 152 can provide control signals to a seed value memory 150 by way of memory control lines 156. Such control values can result in the output one of the number of stored seed values to test pattern generator 106. In the particular embodiment of FIG. 1, a seed selector circuit 152 can be a controller circuit that also provides control signals to test controller 112 by way of BIST control lines 158. Even more particularly, a seed selector circuit 152 can control BIST operations according to a reset input RST, an enable input EN and a clock input CLK. Thus, a seed selector circuit 152 can also operate at a device clock speed (e.g., CLK).

Having described a BIST arrangement according to a first embodiment, a BIST method according to an embodiment will now be described with reference to FIG. 2. A method 200 can include transferring one of multiple seed values from a built-in memory to a pattern generator (step 202). Such a step is in contrast to conventional approaches that may load a seed value from a location that is not onboard, such as from automatic test equipment (ATE) or an external location by way of input test interface. A method 200 may then continue by self-testing according to multiple patterns generated from the loaded seed value (step 204).

Figure 2:
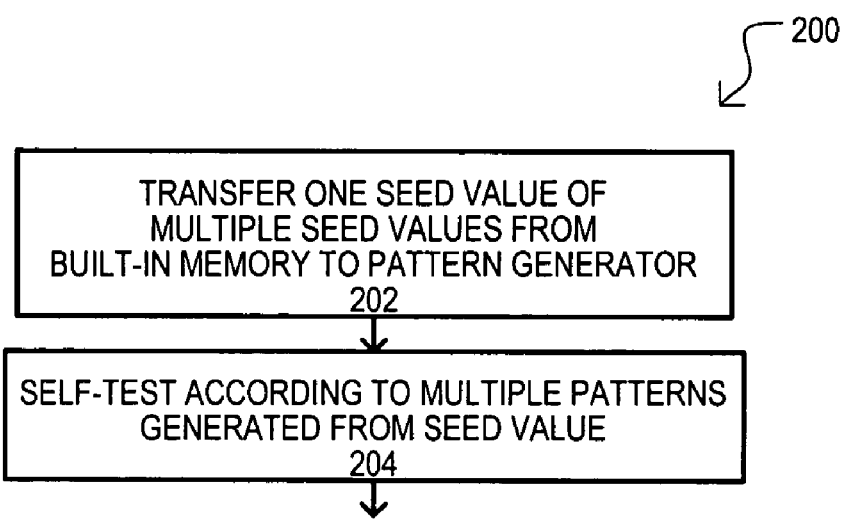
FIG. 2 is a block schematic diagram of a built-in self-test (BIST) method according to an embodiment.

A method according to the embodiment of FIG. 2 may have a number of advantages over the above-described conventional approaches. First, seed values may be rapidly loaded in succession increasing a BIST speed. Second, seed values may be selectable, providing flexibility in the type(s) of tests performed. Third, such an arrangement can provide high speed in system testing arrangements, as multiple seed values are already present and ready for loading. Fourth, such an arrangement can be highly compatible with built-in self-repair, as a high degree of coverage is possible with multiple seed values, enabling more precise identification/location of a fault.

Figure 3:
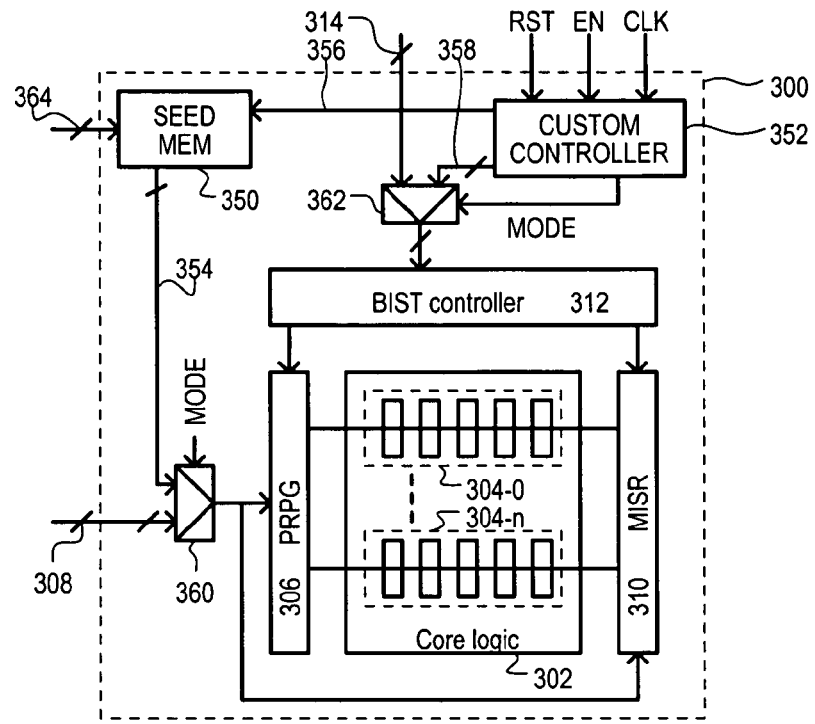
FIG. 3 is a block schematic diagram of another embodiment of the present invention.

Referring now to FIG. 3, a second embodiment of a BIST section is set forth in a block diagram and designated by the general reference character 300. A BIST section 300 can include some of the same items as FIG. 1. Accordingly, like items will be referred to by the same reference character but with the first digit being a "3" instead of a "1".

The embodiment of FIG. 3 can differ from that of FIG. 1 in that BIST data and/or control values may be loaded via separate inputs. Such an arrangement can allow for BIST operations to occur by way of seed values already present within an onboard seed memory, or according to seed values received externally on a test input. Thus, the embodiment of FIG. 3 can include a test input 308, a test control input 314, a seed multiplexer 360, a control multiplexer 362, and a memory input 364.

A seed multiplexer 360 can operate according to a mode value MODE, and enable a seed value to be applied to a test pattern generator 306 from a seed value memory 350 or from an external source via a test input 308. In a similar fashion, control multiplexer 362 can operate according to a mode value MODE, and enable BIST control values to be provided to a test controller 312 from a seed selector circuit 352 or from an external source via a test control input 314.

It is understood that in the embodiment of FIG. 3, a seed selector circuit 352 can control BIST operations according to a reset input RST, an enable input EN and a clock input CLK, as in the case of FIG. 1.

Still further, the embodiment of FIG. 3 represents an arrangement in which a seed value memory 364 can be a written to (e.g., DRAM, SRAM, CAM), or programmed (e.g., EPROM, EEPROM, MRAM, FeRAM), or otherwise loaded with seed value data. As such, a memory input 364 can be provided for entering data and/or address and/or control values for such an operation. Further, in the case of memory types needing a higher (or lower) than supply voltage, such a voltage can be applied by way of such inputs, as well. It is also understood that all or a portion of a memory input 364 can overlap with test input (e.g., 308), and vice versa, to avoid higher pin counts.

Still further, alternate embodiments can include serial interfaces for providing test data/control values to a BIST section 300.

Figure 11:
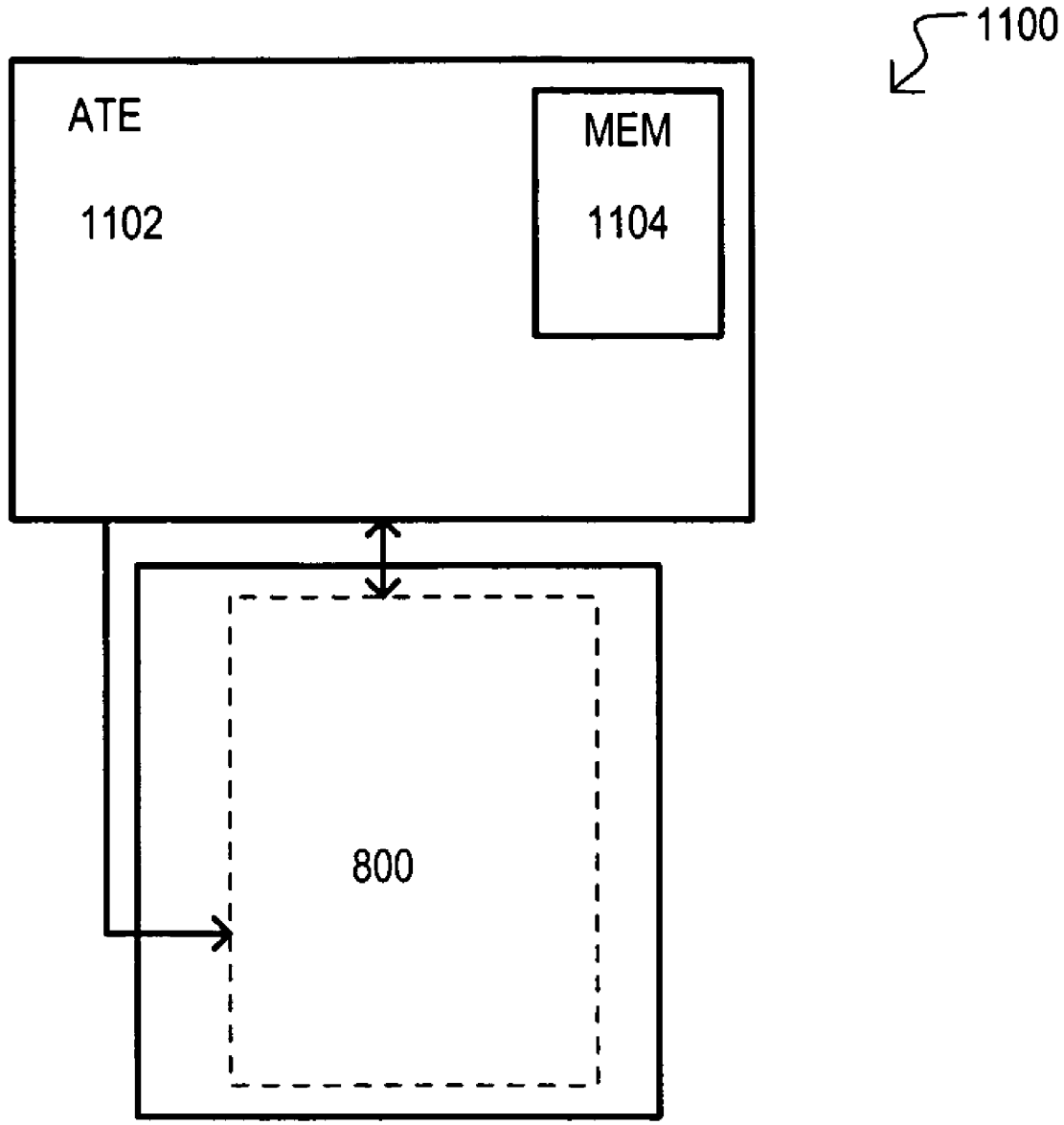
FIG. 11 is a block diagram of a second conventional test arrangement.

An arrangement like that of FIG. 3 can allow an integrated circuit to undergo BIST operations with onboard seed values, as well as BIST operations under the control of automatic test equipment, or the like, as set forth in FIG. 11.

Figure 4:
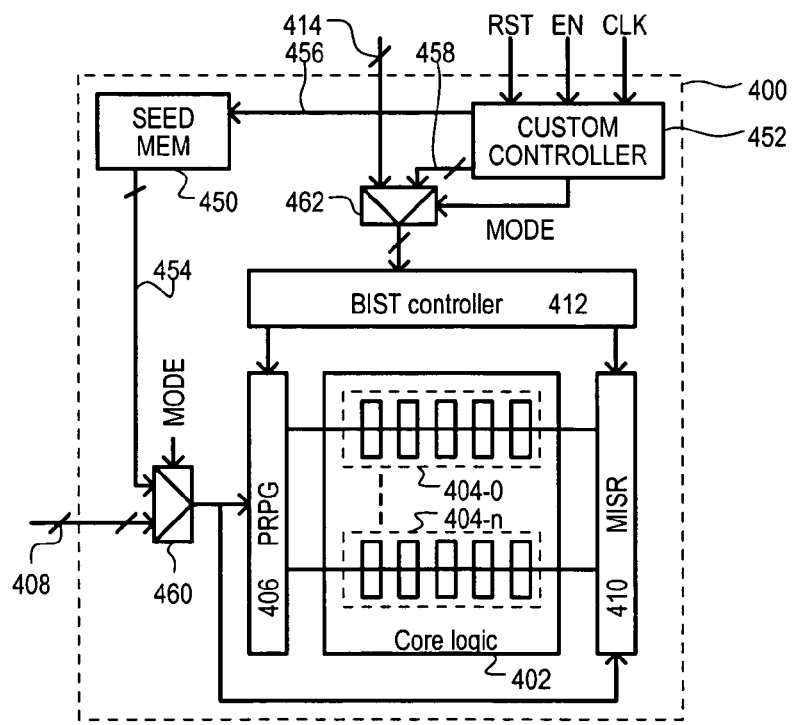
FIG. 4 is a block schematic diagram of another embodiment of the present invention.

Referring now to FIG. 4, a third embodiment of a BIST section is set forth in a block diagram and designated by the general reference character 400. A BIST section 400 can include the same essential items as FIG. 3. Accordingly, like items will be referred to by the same reference character but with the first digit being a "4" instead of a "3".

The embodiment of FIG. 4 can differ from that of FIG. 3, in that a seed value memory can be fabricated or otherwise manufactured to include seed values (e.g., mask ROM, fuse-type structures). As such, a memory input (e.g., 364 of FIG. 3) may not be included. This can allow for smaller pin counts and/or fewer signal lines than the embodiment of FIG. 3.

Having described the structure of various embodiments of the present invention, another method according to an embodiment will now be described with reference to FIG. 5.

Figure 5:
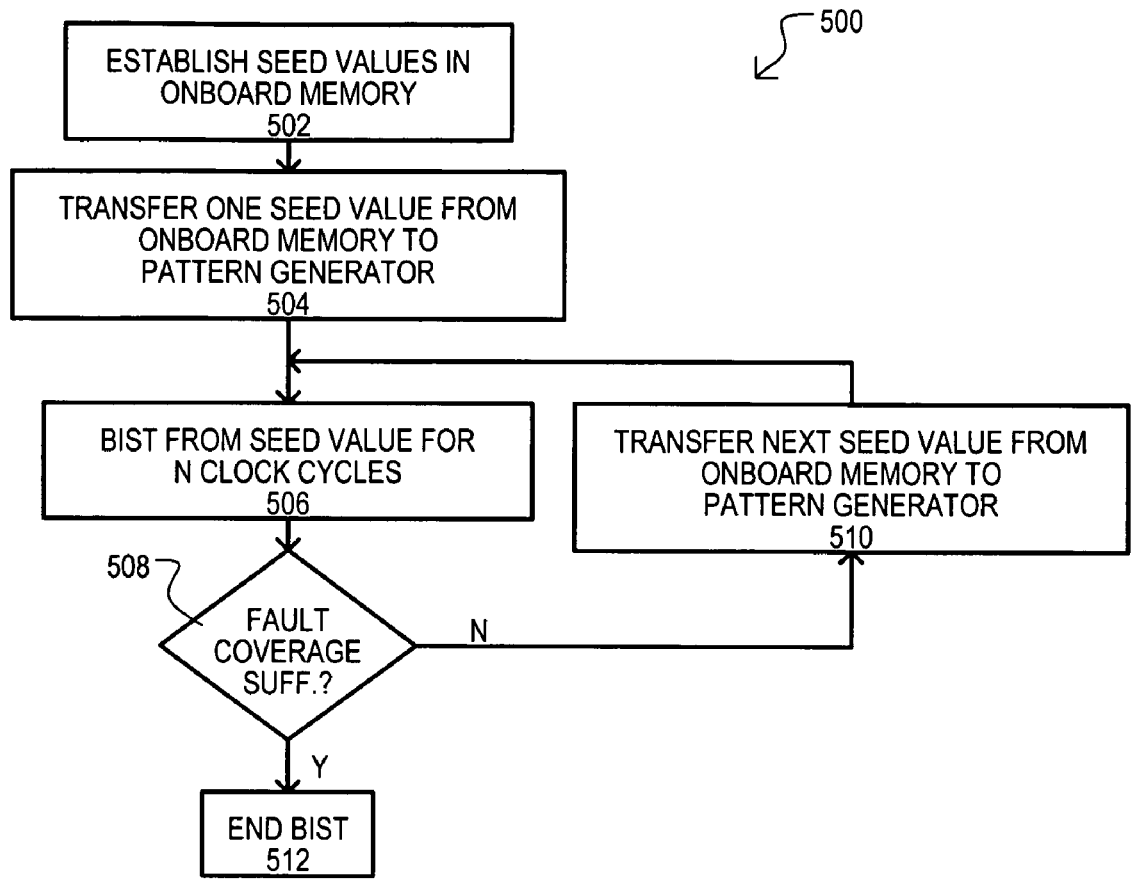
FIG. 5 is a flow diagram of another BIST method according to an embodiment.

Referring to FIG. 5, a method 500 can include establishing seed values in an onboard memory (step 502). A step 502 can include, but is not limited to, any of the various methods noted above, such as establishing seed values according to a manufacturing step (e.g., mask ROM, fuse blowing, anti-fuse setting) or write/program steps (e.g., programmable ROMs and various RAMs, or other memory types).

A method 500 can continue by transferring at least one of the seed values from a seed value memory to a pattern generator (step 504). As but one example, necessary control values can be generated (e.g., address and control lines) for accessing a selected seed value, and the selected seed value can be placed on one or more data lines.

Once a seed value has been transferred to a test pattern generator, a BIST operation-test can be performed based on such a seed value (step 506). As but one example, such a step can include a linear feedback shift register type circuit generating a sequence of test pattern values every clock cycle based on an initial seed value.

Once a BIST operation is complete, a method 500 can determine if a test has provided sufficient coverage (step 508). If test coverage is not sufficient, another, different seed value can be transferred from a seed memory to a test patter generator (step 510). BIST operations can then be repeated. If test coverage is deemed sufficient, BIST operations can end (step 512).

While in some embodiments, it may be desirable to provide a dedicated memory as a seed value memory, in other embodiments it may be desirable to utilize an existing memory or memory structure. One very particular example of such an arrangement is shown in FIG. 6.

Figure 6:
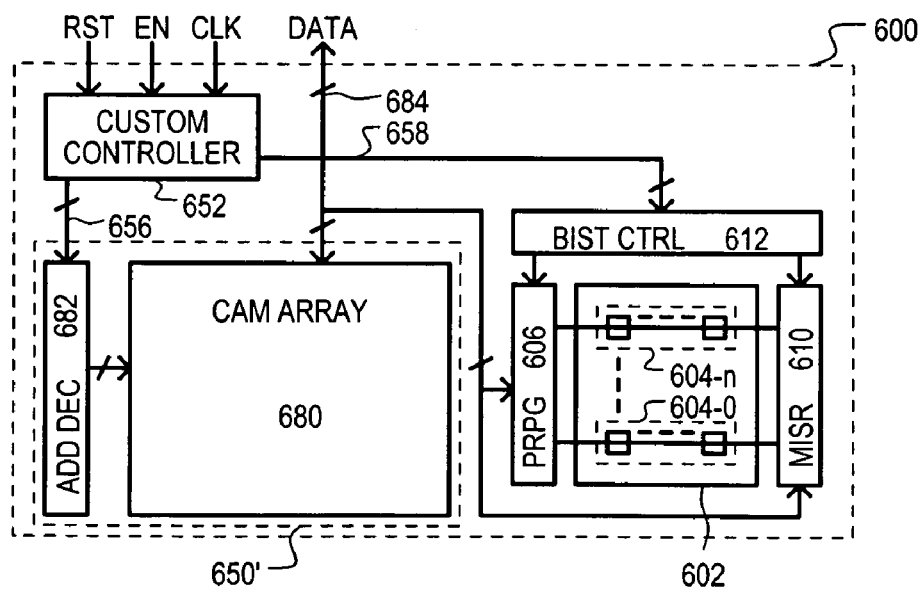
FIG. 6 is a block schematic diagram of another embodiment of the present invention.

FIG. 6 is a block schematic diagram of a content addressable memory CAM integrated circuit, designated by the general reference character 600. A CAM device 600 can include the same general items as FIG. 1. Like items are referred to by the same reference character, but with the first digit being a "6" instead of a "1".

The arrangement of FIG. 6 can differ from that of FIG. 1 in that at least a portion of a CAM memory 650' can be utilized as a seed value memory. In particular, seed values can be written to entries within a CAM array 680 by operation of seed selector circuit 652. As but one example, to store seed values in CAM device 600, a seed selector circuit 652 can access a CAM array 680 for a write operation by way of address decoder 682 while seed values are presented on a data bus 684. In a BIST operation, a seed selector circuit 652 can access a CAM array 680 for a read operation by way of address decoder 682. Such an operation can place seed values on a data bus 684, which may apply such seed values to a pattern generator 606.

Figure 7:
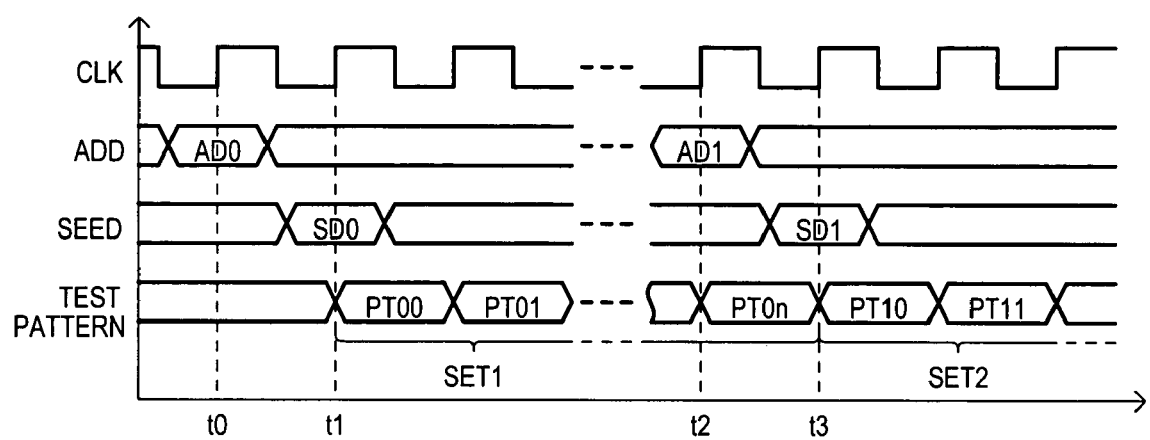
FIG. 7 is a timing diagram showing the operation of BIST circuit according to an embodiment of the present invention.

As noted above, including and accessing seed values in a built-in (e.g., onboard) memory can allow for wide coverage clock speed testing. One particular example of a BIST operation at clock speeds according to one embodiment is set forth in FIG. 7. FIG. 7 is a timing diagram having a waveform CLK that can represent the clock of an integrated circuit, a waveform ADD that can represent access signals applied to a seed value memory, a waveform SEED that can represent a seed value retrieved from a seed value memory and provided to a test pattern generator, and a waveform TEST PATTERN that can represent test patterns generated by a test pattern generator from seed values.

At time t0, a seed value memory can be accessed. Such an operation can include, but is not limited to, applying an address value (AD0) to memory circuit.

At time t1, a seed value (SD0) corresponding to address value (AD0) can be output from a seed memory. In response to such a seed value (SD0), a test pattern generator can start generating a sequence of test patterns. Such a sequence of test patterns is shown as "SET1" and includes test patterns PT00 to PT0n.

At time t2, a seed value memory can be accessed for a second time. Such an operation can include applying an address value (AD1) to a memory circuit, for example. It is noted that as a next seed value is being accessed (i.e., as AD1 is being applied) a previous sequence of test patterns (SET1) may not yet be finished.

At time t3, a seed value (SD1) corresponding to address value (AD1) can be output from a seed memory. In response to such a seed value (SD1), a test pattern generator can start generating a next sequence of test patterns. Such a sequence of test patterns is shown as "SET2" and includes test patterns PT10, PT11 . . . It is noted that a first test pattern from SET2 (PT10) occurs on the next clock cycle following the last test pattern from SET1 (PT0n).

In this way, multiple seed values can be rapidly provided to a test pattern generator from a built-in memory circuit to enable at clock testing with a high degree of test coverage.

It is noted that a devices and methods according to the disclosed embodiments may be particularly compatible with in system testing and repair. More particularly, an integrated circuit having on-board seed values can provide a self-test and/or self-diagnosis results having a high degree of coverage. Such results can be utilized to activate appropriate built-in self-repair circuits. Thus, a device may be repaired in-system in rapid fashion for minimal interruption in overall system operation.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device having a self-test capability, comprising:
    a test pattern generator that can generate a plurality of test pattern values for built-in self-test (BIST) circuits in response to a single seed value;
    a seed value store formed in the same substrate as the BIST circuits and coupled to the test pattern generator that stores a plurality seed values; and
    a seed selector circuit coupled to the seed value store that selects a seed value for input to the test pattern generator.

2. The integrated circuit device of claim 1, wherein:
    the test pattern generator comprises a linear feedback shift register.

3. The integrated circuit device of claim 1, wherein:
    the seed value store comprises a random access memory (RAM).

4. The integrated circuit device of claim 3, further including:
    the RAM comprises volatile storage circuits; and
    a data input for writing seed values to the RAM from outside the integrated circuit.

5. The integrated circuit device of claim 4, wherein:
    the volatile storage circuits comprise memory circuits selected from the group consisting of: dynamic RAM cells, static RAM cells, content addressable memory (CAM) cells, pseudo static RAM cells.

6. The integrated circuit device of claim 3, wherein:
    the RAM comprises nonvolatile storage circuits.

7. The integrated circuit device of claim 6, wherein:
    the nonvolatile storage circuits are selected from the group consisting of: mask programmable read only memory (ROM) cells, electrically programmable ROM cells, electrically erasable and programmable ROM cells, magnetic RAM cells, and ferroelectric RAM cells.

8. The integrated circuit device of claim 1, further including:
    a seed value multiplexer having a first input coupled to the seed value store, a second input coupled to an external seed input, and an output coupled to the test pattern generator.

9. The integrated circuit device of claim 1, further including:
    a built-in self-test (BIST) controller that controls the input of test pattern values from the test pattern generator to the BIST circuits.

10. The integrated circuit device of claim 9, further including:
    a multiple input signature register that compresses multiple output values from BIST circuits to generate output signatures.

11. The integrated circuit device of claim 9, further including:
    a BIST control multiplexer having a first input coupled to a test mode controller, a second input coupled to an external control input, and an output coupled to the BIST controller.

12. A method for self-testing an integrated circuit device, comprising the steps of
    (a0) establishing a plurality of seed values within a seed value memory formed in the integrated circuit, including writing values to a volatile seed value memory circuit;
    (a1) loading a first seed value of a plurality of seed values stored by the integrated circuit device into a test pattern generator;
    (b) generating a plurality of test patterns from the loaded seed value; and
    (c) self-testing a portion of the integrated circuit according to the generated test patterns.

13. The method of claim 12, wherein:
    the step (a1) of loading a first seed value includes applying an address value to random access type memory that stores the seed values.

14. The method of claim 12, wherein:
    the step (a1) of loading a first seed value includes enabling a multiplexer path between a memory that stores the seed values and a pattern generating circuit.

15. The method of claim 12, wherein:
    the step (a0) of establishing a plurality of seed values further includes programming a nonvolatile seed value memory circuit.

16. The method of claim 12, further including:
    (d) determining if the step of self-testing a portion of the integrated circuit according to the patterns provides a predetermined level of test coverage with respect to integrated circuit functions; and
    if the test coverage does not meet the predetermined level, repeating steps (a1) to (d) with a different seed value.

17. An integrated circuit, comprising:
    a seed value memory formed in a substrate that stores a plurality of seed values, comprising a random access memory having volatile memory cells;
    a test pattern generator formed in the substrate and having an input coupled to the seed value memory that generates a plurality test input values for built-in self-test (BIST) scan chains in response to a single seed value; and
    an output register formed in the substrate that captures output values of the BIST scan chains.

18. The integrated circuit of claim 17, wherein:
    the test pattern generator comprises a linear feedback shift register having a test pattern bit register corresponding to each scan chain; and
    the output register comprises a multiple input signature registers having a test result bit register coupled to each scan chain.

* * * * *